US011108002B2

(12) United States Patent
Waki

(10) Patent No.: US 11,108,002 B2
(45) Date of Patent: Aug. 31, 2021

(54) LIGHT EMITTING DEVICE

(71) Applicants: PIONEER CORPORATION, Tokyo (JP); TOHOKU PIONEER CORPORATION, Tendo (JP)

(72) Inventor: Noriaki Waki, Yamagata (JP)

(73) Assignees: PIONEER CORPORATION, Tokyo (JP); TOHOKU PIONEER CORPORATION, Tendo (JP)

(*) Notice: Subject to any disclaimer, the term of this patent is extended or adjusted under 35 U.S.C. 154(b) by 0 days.

(21) Appl. No.: 16/318,669

(22) PCT Filed: Sep. 26, 2016

(86) PCT No.: PCT/JP2016/078283
§ 371 (c)(1),
(2) Date: Jan. 17, 2019

(87) PCT Pub. No.: WO2018/055767
PCT Pub. Date: Mar. 29, 2018

(65) Prior Publication Data
US 2019/0288224 A1    Sep. 19, 2019

(51) Int. Cl.
*H01L 51/52* (2006.01)
*H01L 51/00* (2006.01)
(Continued)

(52) U.S. Cl.
CPC .......... *H01L 51/0096* (2013.01); *H01L 33/50* (2013.01); *H01L 51/50* (2013.01);
(Continued)

(58) Field of Classification Search
CPC ..... H01L 51/0096; H01L 51/50; H01L 33/50; H01L 51/5036; H01L 51/5203;
(Continued)

(56) References Cited

U.S. PATENT DOCUMENTS 5,902,688 A * 5/1999 Antoniadis ......... H01L 27/3239
                                                   313/505
2008/0180020 A1* 7/2008 Cok ....................... H05B 33/28
                                                   313/503
(Continued)

FOREIGN PATENT DOCUMENTS

JP    H11-160704 A    6/1999
JP    2005-216713 A   8/2005
(Continued)

OTHER PUBLICATIONS https://en.wikipedia.org/w/index.php?title=CIELAB_color_space&oldid=737674731 as revision on Sep. 4, 2016 (Year: 2016).*
(Continued)

*Primary Examiner* — Jarrett J Stark
(74) *Attorney, Agent, or Firm* — Procopio, Cory, Hargreaves & Savitch LLP

(57) ABSTRACT

When visible light (light having wavelength of 380 nm or more and 780 nm or less) is transmitted through a first light transmitting region (TR1) (a first light emitting portion (160*a*)), a second light transmitting region (TR2) (a second light emitting portion (160*b*)) and a third light transmitting region (TR3) (a first light transmitting portion (162)), more specifically, when light from a D65 light source is transmitted through the first light transmitting region (TR1), the second light transmitting region (TR2) and the third light transmitting region (TR3), both of a color difference between the first light transmitting region (TR1) and the third light transmitting region (TR3) and a color difference between the second light transmitting region (TR2) and the third light transmitting region (TR3) are both, for example, 0.4 or more and 6.5 or less in CIELAB. This reduces conspicuousness of both of the first light transmitting region (TR1) and the second light transmitting region (TR2). Furthermore, it is possible to identify the first light transmitting
(Continued)

region (TR1), the second light transmitting region (TR2), and the third light transmitting region (TR3).

10 Claims, 10 Drawing Sheets

(51) Int. Cl.
*H01L 33/50* (2010.01)
*H01L 51/50* (2006.01)
*H05B 33/06* (2006.01)
*H05B 33/22* (2006.01)
*H05B 33/26* (2006.01)

(52) U.S. Cl.
CPC ...... *H01L 51/5036* (2013.01); *H01L 51/5203* (2013.01); *H05B 33/06* (2013.01); *H05B 33/22* (2013.01); *H05B 33/26* (2013.01)

(58) Field of Classification Search
CPC ........ H05B 33/06; H05B 33/22; H05B 33/26; Y02E 10/549
See application file for complete search history.

(56) References Cited

U.S. PATENT DOCUMENTS

| | | | | |
|---|---|---|---|---|
| 2008/0203943 A1* | 8/2008 | Baaijens | ............... | H05B 45/20 |
| | | | | 315/291 |
| 2009/0212687 A1* | 8/2009 | Cok | ............... | H01L 51/5265 |
| | | | | 313/504 |
| 2010/0090597 A1* | 4/2010 | Werners | ............ | B32B 17/10541 |
| | | | | 313/512 |
| 2010/0118006 A1* | 5/2010 | Kimura | ............... | G09G 3/3611 |
| | | | | 345/205 |
| 2013/0162616 A1* | 6/2013 | Park | ............... | G09G 3/3648 |
| | | | | 345/211 |
| 2014/0368529 A1* | 12/2014 | Ryu | ............... | G09G 3/32 |
| | | | | 345/592 |
| 2015/0014627 A1* | 1/2015 | Yu | ............... | H01L 31/046 |
| | | | | 257/13 |
| 2015/0108448 A1* | 4/2015 | Dai | ............... | C09K 11/06 |
| | | | | 257/40 |
| 2015/0355729 A1* | 12/2015 | Park | ............... | G09G 5/003 |
| | | | | 345/173 |
| 2016/0064363 A1* | 3/2016 | Bower | ............... | H01L 25/167 |
| | | | | 315/294 |
| 2016/0141541 A1* | 5/2016 | Noda | ............... | H01L 27/3206 |
| | | | | 257/40 |
| 2016/0181330 A1* | 6/2016 | Liu | ............... | H01L 27/3269 |
| | | | | 257/40 |
| 2016/0197131 A1* | 7/2016 | Park | ............... | G02F 1/133377 |
| | | | | 349/139 |
| 2016/0204387 A1* | 7/2016 | Forrest | ............... | H01L 51/5275 |
| | | | | 257/40 |
| 2016/0240811 A1* | 8/2016 | Kim | ............... | H01L 51/5234 |
| 2016/0247864 A1* | 8/2016 | Zhang | ............... | H01L 27/3258 |
| 2016/0336530 A1* | 11/2016 | Zhang | ............... | H01L 51/5234 |
| 2016/0380038 A1* | 12/2016 | Kang | ............... | H01L 27/3246 |
| | | | | 257/40 |
| 2018/0005574 A1* | 1/2018 | Kim | ............... | H01L 51/5296 |
| 2018/0033841 A1* | 2/2018 | Yang | ............... | H01L 27/3246 |
| 2018/0061905 A1* | 3/2018 | Choi | ............... | H01L 27/3246 |
| 2018/0077773 A1* | 3/2018 | Harkonen | ............... | G09G 3/30 |
| 2018/0090551 A1* | 3/2018 | Sato | ............... | G09G 3/3233 |
| 2019/0143736 A1* | 5/2019 | Kawashita | ............... | G02B 5/18 |
| | | | | 359/567 |
| 2019/0258107 A1* | 8/2019 | Fuju | ............... | H01L 21/0276 |

FOREIGN PATENT DOCUMENTS

| | | |
|---|---|---|
| JP | 2016-100126 A | 5/2016 |
| WO | 2016/042845 A1 | 3/2016 |

OTHER PUBLICATIONS http://www.colorwiki.com/index.php?title=Delta_E&oldid=6318 Revision as of 20:32, May 25, 2011 (Year: 2011).*
International Search Report for related International application No. PCT/JP2016/078283 dated Dec. 20, 2016; 1 page.

* cited by examiner

LIGHT EMITTING DEVICE

CROSS-REFERENCE TO RELATED APPLICATIONS

This application is a U.S. National Stage entry of PCT Application No: PCT/JP2016/078283 filed Sep. 26, 2016, the contents of which are incorporated herein by reference.

TECHNICAL FIELD

The present invention relates to a light emitting device.

BACKGROUND ART

In recent years, an organic light emitting diode (OLED) having a light transmitting property has been developed. For example, Patent Document 1 discloses alight transmitting OLED which displays segments (specifically, seven segments). The OLED includes a first electrode, an organic layer, and a plurality of second electrodes. The first electrode is a transparent electrode and has a substantially same shape as the segments. The organic layer covers the first electrode. The plurality of the second electrodes are aligned on the organic layer so as to overlap the first electrode. Accordingly light can be transmitted through between two adjacent second electrodes. Thus, the OLED has a light transmitting property.

RELATED DOCUMENT

Patent Document

[Patent Document 1] Japanese Unexamined Patent Publication No. 2016-100126

SUMMARY OF THE INVENTION

The present inventors have studied a new structure of a light transmitting OLED. The OLED includes an organic layer and a conductive layer, and the organic layer and the conductive layer extend over a light emitting portion and a light transmitting portion. Studies of the present inventors have revealed that a color difference may occur between the light emitting portion and the light transmitting portion when visible light is transmitted through such an OLED. The color difference is preferably as small as possible. Too small color difference, however, makes it difficult to identify the light emitting portion and the light transmitting portion, and, for example, makes it difficult to inspect the OLED.

One example of the problems to be solved by the present invention is to reduce conspicuousness of a color difference in a light transmitting OLED between a light emitting portion and a light transmitting portion to an identifiable degree.

Solution to Problem

The invention described in claim 1 is a light emitting device comprising:

a first light emitting portion and a first light transmitting portion;

a first conductive layer extending over the first light emitting portion and the first light transmitting portion;

an organic layer comprising an emission layer extending over the first light emitting portion and the first light transmitting portion; and an insulating layer defining the first light emitting portion and extending over the first light transmitting portion, wherein a color difference between the first light emitting portion and the first light transmitting portion is 0.4 or more and 6.5 or less in CIELAB when visible light is transmitted through the first light emitting portion and the first light transmitting portion.

BRIEF DESCRIPTION OF THE DRAWINGS

The foregoing and other objects, and features and advantages will become more apparent from the following description of preferred exemplary embodiments and the accompanying drawings.

DESCRIPTION OF EMBODIMENTS

Figure 1:
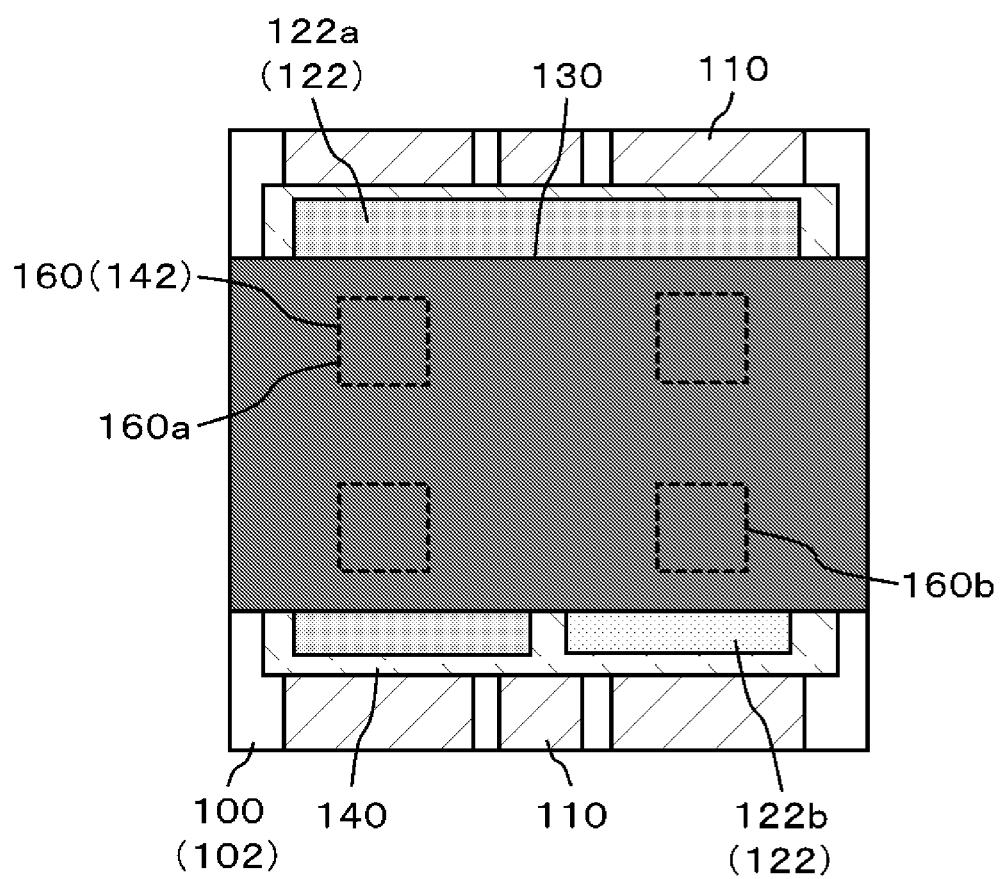
FIG. 1 is a plan view showing a light emitting device according to an embodiment.

Hereinafter, embodiments of the present invention will be described with reference to the drawings. In all the drawings, the same components are denoted by the same reference numerals, and the description thereof will not appropriately be repeated.

Figure 2:
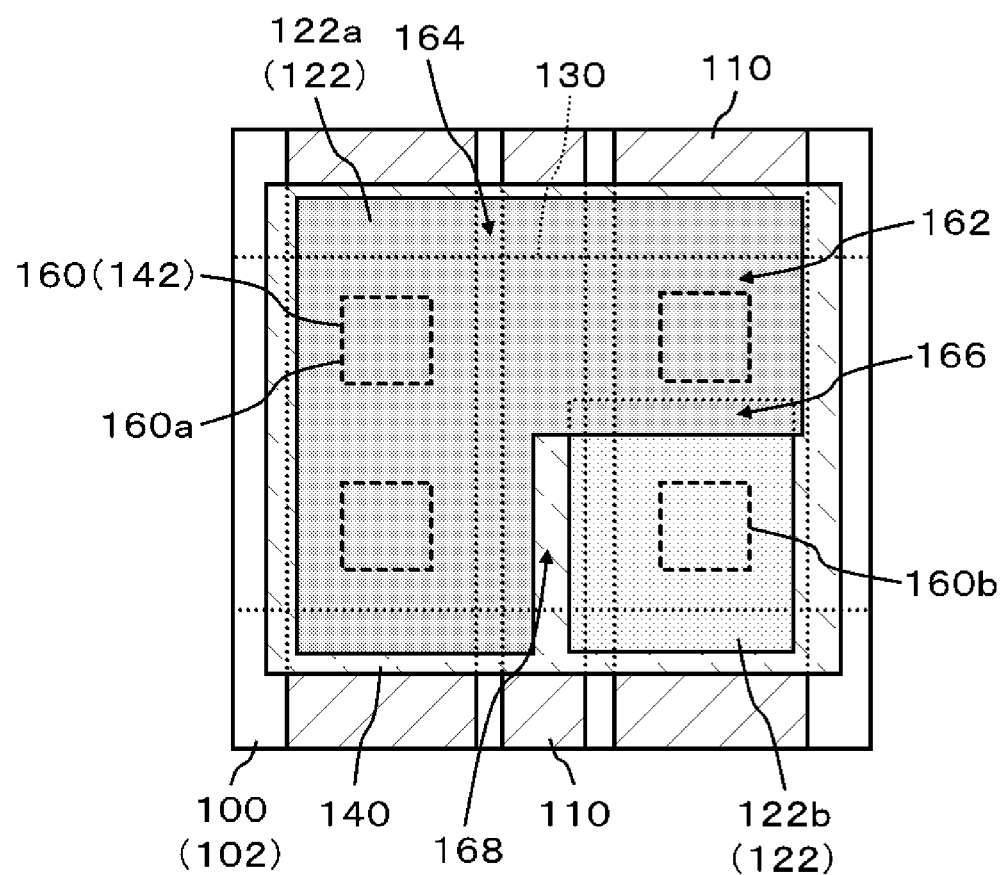
FIG. 2 is a diagram in which a conductive layer is removed from FIG. 1.
Figure 3:
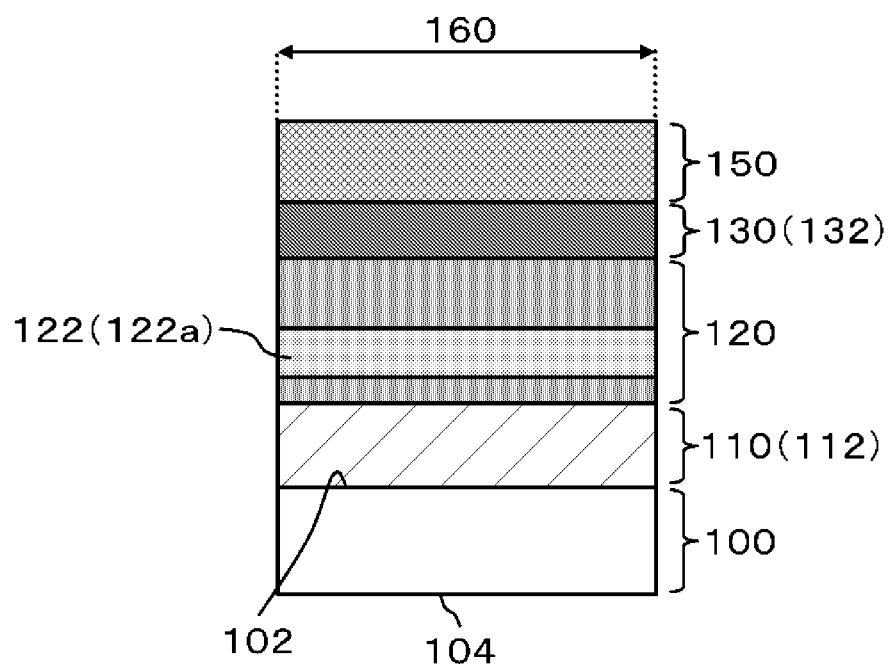
FIG. 3 is a cross-sectional view showing alight emitting portion shown in FIG. 2.
Figure 4:
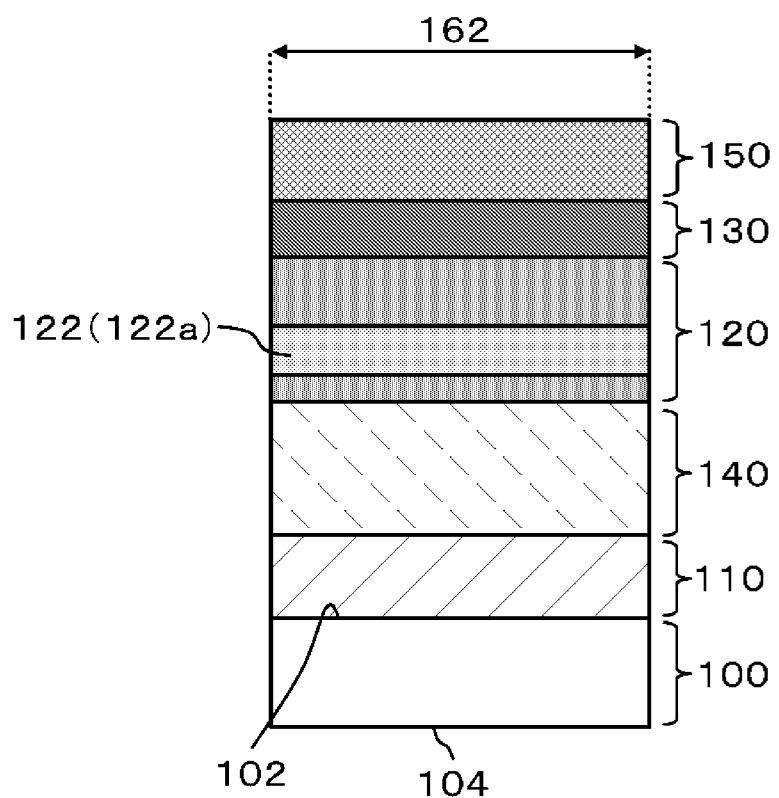
FIG. 4 is a cross-sectional view showing a first light transmitting portion shown in FIG. 2.
Figure 5:
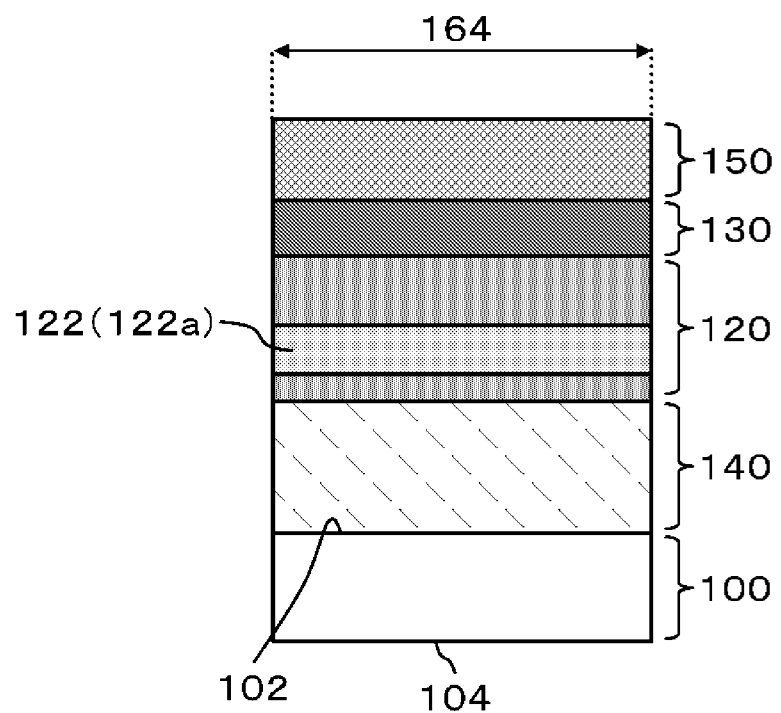
FIG. 5 is a cross-sectional view showing a second light transmitting portion shown in FIG. 2.
Figure 6:
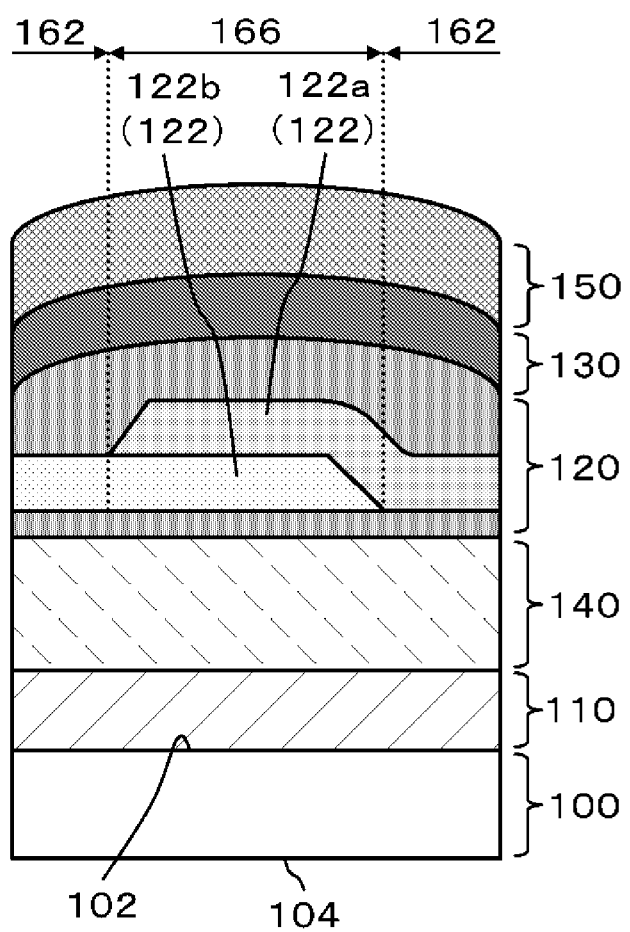
FIG. 6 is a cross-sectional view showing a third light transmitting portion shown in FIG. 2.
Figure 7:
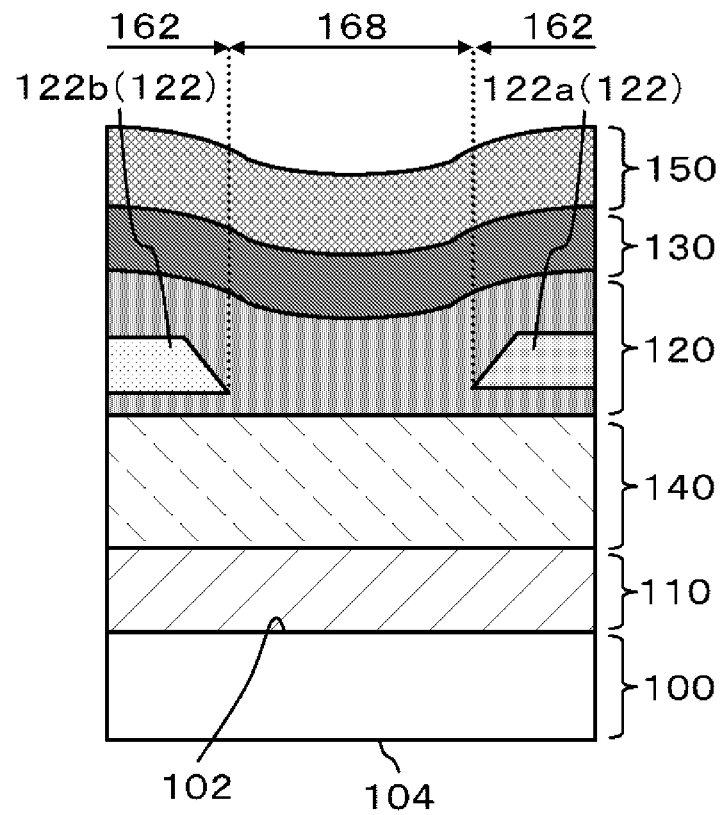
FIG. 7 is a cross-sectional view showing a fourth light transmitting portion shown in FIG. 2.

FIG. 1 is a plan view showing a light emitting device 10 according to an embodiment. FIG. 2 is a diagram in which a conductive layer 130 is removed from FIG. 1. FIG. 3 is a cross-sectional view showing a light emitting portion 160 shown in FIG. 2. FIG. 4 is a cross-sectional view showing a first light transmitting portion 162 shown in FIG. 2. FIG. 5 is a cross-sectional view showing a second light transmitting portion 164 shown in FIG. 2. FIG. 6 is a cross-sectional view showing a third light transmitting portion 166 shown in FIG. 2. FIG. 7 is a cross-sectional view showing a fourth light transmitting portion 168 shown in FIG. 2. The light emitting device 10 includes a substrate 100, a plurality of conductive layers 110, an organic layer 120, the conductive layer 130, an insulating layer 140, a cap layer 150, and the plurality of the light emitting portions 160. For the purpose of explanation the cap layer 150 is not shown in FIGS. 1 and 2.

The substrate 100 has a light transmitting property. In one example, the substrate 100 is a glass substrate. In the example shown in FIGS. 1 to 7, the substrate 100 has a first surface 102 and a second surface 104. The plurality of the conductive layers 110, the organic layer 120, the conductive layer 130, the insulating layer 140, and the cap layer 150 are on the first surface 102. The second surface 104 is opposite to the first surface 102.

The conductive layer 110 has a light transmitting property. In other words, the conductive layer 110 is a transparent conductive layer. In one example, the conductive layer 110 includes indium tin oxide (ITO).

The organic layer 120 has a light transmitting property and includes a plurality of the emission layers (EML) 122 (an emission layer (EML) 122a and an emission layer (EML) 122b). Each of the EML 122a and EML 122b contains an organic compound that emits a light by electroluminescence. Wavelength of a light emitted from the EML 122a is different from wavelength of light emitted from the EML 122b. Specifically, the EML 122a emits red light (light having wavelength of approximately 600 nm or more and 750 nm or less), and the EML 122b emits green light (light having wavelength of approximately 500 nm or more and 570 nm or less).

The conductive layer 130 has a light transmitting property. In other words, the conductive layer 130 is a transparent conductive layer. In one example, the conductive layer 130 includes a MgAg alloy. The thickness of the conductive layer 130 is considerably thin, for example, 15 nm or less. Thus, the conductive layer 130 has a light transmitting property. In one example, a transmittance of the conductive layer 130 for visible light (light having a wavelength of 380 nm or more and 780 nm or less) is 65% or more, preferably 80% or more.

The insulating layer 140 has a light transmitting property. In one example, the insulating layer 140 is an inorganic insulating layer, and specifically includes silicon oxide ($SiO_2$). In another example, the insulating layer 140 may be an organic insulating layer, and specifically may include polyimide.

The insulating layer 140 has a plurality of openings 142. A region exposed from the opening 142 of the insulating layer 140 functions as the light emitting portion 160, in other words, the insulating layer 140 defines a plurality of the light emitting portions 160.

The cap layer 150 has a light transmitting property. In one example, the cap layer 150 is an insulating layer. The cap layer 150 covers the conductive layer 130. Thus, the cap layer 150 alleviates a step difference in refractive index between the conductive layer 130 and an air layer, to improve a transmittance.

Each of the plurality of the light emitting portions 160 emits light by a voltage between the conductive layer 110 and the conductive layer 130. Specifically, the conductive layer 110 has a region functioning as an anode (first electrode 112) in a region that overlaps the opening 142 of the insulating layer 140. The conductive layer 130 has a region functioning as a cathode (second electrode 132) in a region that overlaps the opening 142 of the insulating layer 140. A first light emitting portion 160a of the plurality of the light emitting portions 160 emits light from the EML 122a. A second light emitting portion 160b of the plurality of the light emitting portions 160 emits light from the EML 122b.

In the example shown in FIGS. 1 and 2, the light emitting device 10 includes three conductive layers 110. The center conductive layer 110 of the three conductive layers 110 is electrically insulated from the conductive layer 130 by the insulating layer 140. In other words, the conductive layer 110 does not function as the anode and functions as a dummy conductive layer.

In the example shown in FIGS. 1 to 7, the light emitting device 10 is a bottom emission. That is, light from the EML 122 is emitted to the outside from the second surface 104 of the substrate 100.

The light emitting device 10 has a light transmitting property. More specifically, the substrate 100, the plurality of the conductive layers 110, the organic layer 120, the conductive layer 130, the insulating layer 140, and the cap layer 150 all have light transmitting properties. Thus, an object on the first surface 102 side of the substrate 100 is seen through from the second surface 104 side of the substrate 100. In the same manner, an object on the second surface 104 side of the substrate 100 is seen through from the first surface 102 side of the substrate 100.

As shown in FIG. 3, the light emitting portion 160 includes a stack of the substrate 100, the conductive layer 110, the organic layer 120, the conductive layer 130, and the cap layer 150. In other words, the light emitting portion 160 does not have the insulating layer 140 (FIGS. 4 to 7). In the light emitting portion 160, the organic layer 120 includes the EML 122 (the EML 122a in the example shown in FIG. 3).

As shown in FIG. 4, the first light transmitting portion 162 includes a stack of the substrate 100, the conductive layer 110, the insulating layer 140, the organic layer 120, the conductive layer 130, and the cap layer 150. In the first light transmitting portion 162, the organic layer 120 includes the EML 122 (the EML 122a in the example shown in FIG. 4).

As shown in FIG. 5, the second light transmitting portion 164 includes a stack of the substrate 100, the insulating layer 140, the organic layer 120, the conductive layer 130, and the cap layer 150. In other words, the second light transmitting portion 164 does not have the conductive layer 110 (FIGS. 3, 4, 6, and 7). In the first light transmitting portion 162, the organic layer 120 includes the EML 122 (the EML 122a in the example shown in FIG. 5). Especially in the example shown in FIGS. 1 and 2, the second light transmitting portion 164 is between the two adjacent conductive layers 110.

As shown in FIG. 6, the third light transmitting portion 166 includes a stack of the substrate 100, the conductive layer 110, the insulating layer 140, the organic layer 120, the conductive layer 130, and the cap layer 150. In the third light transmitting portion 166, the organic layer 120 includes a plurality of overlapped EMLs 122 (the EML 122a and the EML 122b in the example shown in FIG. 6).

As shown in FIG. 7, the fourth light transmitting portion 168 includes a stack of the substrate 100, the conductive layer 110, the insulating layer 140, the organic layer 120, the conductive layer 130, and the cap layer 150. In the fourth light transmitting portion 168, the organic layer 120 does not include the EML 122.

As shown in FIGS. 3 to 7, the light emitting portion 160, the first light transmitting portion 162, the second light transmitting portion 164, the third light transmitting portion 166, and the fourth light transmitting portion 168 have a common organic layer (organic layer 120), a common first conductive layer (conductive layer 130) and a common cap layer (cap layer 150). In other words, the organic layer 120, the conductive layer 130, and the cap layer 150 extend over the light emitting portion 160, the first light transmitting portion 162, the second light transmitting portion 164, the third light transmitting portion 166, and the fourth light transmitting portion 168. Specifically, as shown in FIGS. 3 to 5, the light emitting portion 160, the first light transmitting portion 162, the second light transmitting portion 164, and the third light transmitting portion 166 have a common emission layer (EML 122a). In other words, the EML 122a extends over the light emitting portion 160, the first light transmitting portion 162, the second light transmitting portion 164, and the third light transmitting portion 166. Furthermore, in the example shown in FIGS. 1 and 2, the first light emitting portion 160a and the second light emitting portion 160b have a common first conductive layer (conductive layer 130). In other words, the conductive layer 130 extends over the first light emitting portion 160a and the second light emitting portion 160b.

As shown in FIGS. 4 to 7, the first light transmitting portion 162, the second light transmitting portion 164, the third light transmitting portion 166, and the fourth light transmitting portion 168 have a common insulating layer (insulating layer 140). In other words, the insulating layer 140 extends over the first light transmitting portion 162, the second light transmitting portion 164, the third light transmitting portion 166, and the fourth light transmitting portion 168.

Figure 8:
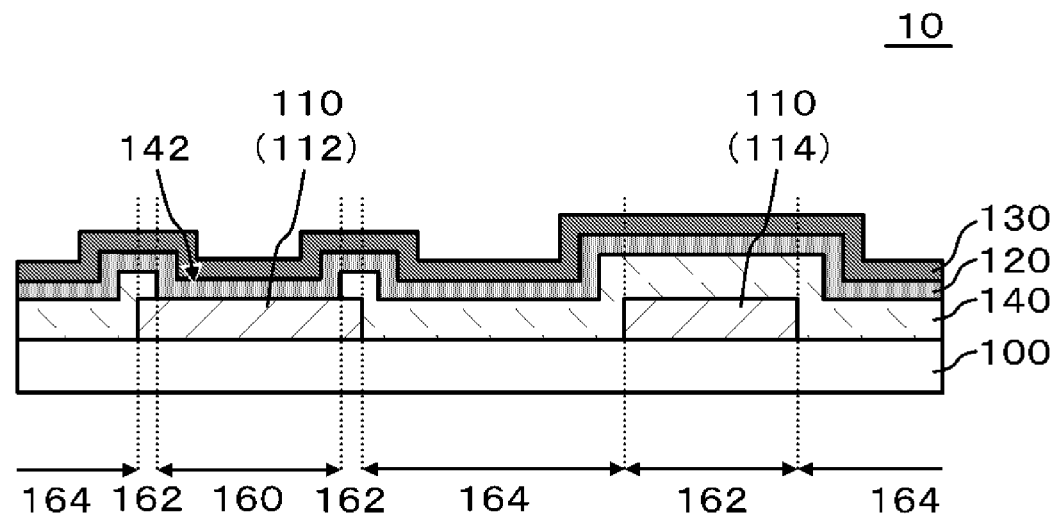
FIG. 8 is a diagram showing an example of a cross section of the light emitting device shown in FIGS. 1 and 2.

FIG. 8 is a diagram showing an example of a cross section of the light emitting device 10 shown in FIGS. 1 and 2. In this figure, the cap layer 150 (FIGS. 3 to 7) is not shown for the purpose of explanation. In the example shown in this figure, the light emitting device 10 has three kinds of regions, that is, the light emitting portion 160, the first light transmitting portion 162 and the second light transmitting portion 164. As described with reference to FIG. 3, the light emitting portion 160 has the stack of the substrate 100, the conductive layer 110, the organic layer 120, and the conductive layer 130. As described with reference to FIG. 4, the first light transmitting portion 162 has the stack of the substrate 100, the conductive layer 110, the insulating layer 140, the organic layer 120, and the conductive layer 130. As described with reference to FIG. 5, the second light transmitting portion 164 has the stack of the substrate 100, the insulating layer 140, the organic layer 120, and the conductive layer 130.

The light emitting device 10 includes two conductive layers 110. The two conductive layers 110 are spaced apart from each other. One of the two conductive layers 110 (the second conductive layer: the conductive layer 110 having a region functioning as the first electrode 112 in the example shown in this figure) overlaps the organic layer 120 and the conductive layer 130 in the light emitting portion 160. The other of the two conductive layers 110 (the third conductive layer: the dummy conductive layer 114 in the example shown in this figure) overlaps the insulating layer 140, the organic layer 120 and the conductive layer 130 in the first light transmitting portion 162.

The organic layer 120 extends over the light emitting portion 160, the first light transmitting portion 162, and the second light transmitting portion 164, and, especially in the example shown in this figure, extends over two spaced-apart conductive layers 110. This can reduce a color difference between the light emitting portion 160, and the first light transmitting portion 162 and the second light transmitting portion 164.

In detail, when visible light (light having wavelength of 380 nm or more and 780 nm or less) from the outside is transmitted through the light emitting device 10, the visible light may have different colors before and after the transmission through the light emitting device 10. Such a phenomenon may occur in one example where a constructive interference for light of a specific wavelength is occurred by the organic layer 120 (in other words, where a microcavity is formed by the organic layer 120), or in another example where the organic layer 120 absorbs light of a specific wavelength. In the example shown in this figure, the organic layer 120 extends over the light emitting portion 160, the first light transmitting portion 162 and the second light transmitting portion 164. This can reduce a color difference between the light emitting portion 160, and the first light transmitting portion 162 and the second light transmitting portion 164, even if the color of the visible light is thus changed.

Furthermore, the thickness of the organic layer 120 is substantially constant over the light emitting portion 160, the first light transmitting portion 162, and the second light transmitting portion 164. In other words, the thickness of the organic layer 120 in the light emitting portion 160 is substantially equal to each of the thickness of the organic layer 120 in the first light transmitting portion 162 and the thickness of the organic layer 120 in the second light transmitting portion 164, and specifically is, for example, 95% or more and 105% or less of the thickness of the organic layer 120 in the first light transmitting portion 162, and for example, 95% or more and 105% or less of the thickness of the organic layer 120 in the second light transmitting portion 164. This can further reduce a color difference between the light emitting portion 160, and the first light transmitting portion 162 and the second light transmitting portion 164.

In detail, a constructive interference for light of a specific wavelength may occur between the upper surface and the lower surface of the organic layer 120. In the example shown in this figure, even if such interference occurs, the thickness of the organic layer 120 is substantially constant over the light emitting portion 160, the first light transmitting portion 162 and the second light transmitting portion 164. Accordingly, a wavelength at which an interference occurs in the organic layer 120 of the light emitting portion 160, a wavelength at which an interference occurs in the organic layer 120 of the first light transmitting portion 162, and a wavelength at which an interference occurs in the organic layer 120 of the second light transmitting portion 164 are almost equal to each other. This can further reduce a color difference between the light emitting portion 160, and the first light transmitting portion 162 and the second light transmitting portion 164.

The insulating layer 140 defines the light emitting portion 160 and extends over the first light transmitting portion 162 and the second light transmitting portion 164, and, especially in the example shown in this figure, extends over two spaced-apart conductive layers 110. This can reduce a color difference between the first light transmitting portion 162 and the second light transmitting portion 164.

In detail, when visible light (light having wavelength of 380 nm or more and 780 nm or less) from the outside is transmitted through the light emitting device 10, the visible light may have different colors before and after the transmission through the light emitting device 10. Such a phenomenon may occur in one example where a constructive interference for light of a specific wavelength is occurred by the insulating layer 140 (in other words, where a microcavity is formed by the insulating layer 140), or in another example where the insulating layer 140 absorbs light of a specific wavelength. In the example shown in this figure, the insulating layer 140 extends over the first light transmitting portion 162 and the second light transmitting portion 164. This can reduce a color difference between the first light transmitting portion 162, and the second light transmitting portion 164, even if the color of the visible light is thus changed.

Furthermore, the thickness of the insulating layer 140 is substantially constant over the first light transmitting portion 162, and the second light transmitting portion 164. In other words, the thickness of the insulating layer 140 in the second light transmitting portion 164 is substantially equal to the thickness of the insulating layer 140 in the first light transmitting portion 162, and specifically is, for example, 95% or more and 105% or less of the thickness of the insulating layer 140 in the first light transmitting portion 162. This can further reduce a color difference between the first light transmitting portion 162, and the second light transmitting portion 164.

In detail, a constructive interference for light of a specific wavelength may occur between the upper surface and the lower surface of the insulating layer 140. In the example shown in this figure, even if such interference occurs, the thickness of the insulating layer 140 is substantially constant over the first light transmitting portion 162 and the second light transmitting portion 164. Accordingly, a wavelength at which an interference occurs in the insulating layer 140 of the first light transmitting portion 162 and a wavelength at which an interference occurs in the insulating layer 140 of the second light transmitting portion 164 are almost equal to each other. This can further reduce a color difference between the first light transmitting portion 162, and the second light transmitting portion 164.

Figure 9:
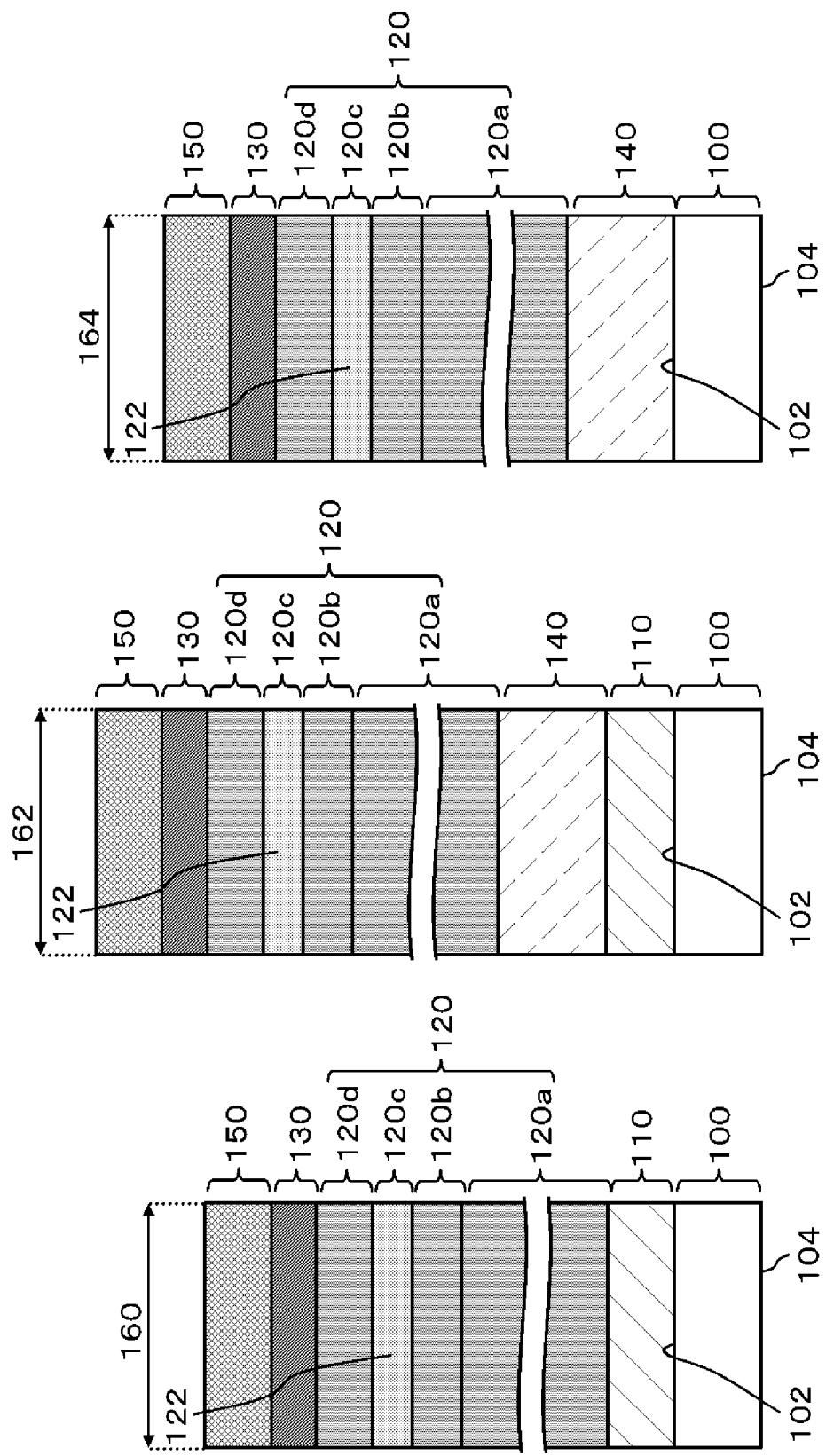
FIG. 9 is cross-sectional views showing a first detailed example of each of the light emitting portion, the first light transmitting portion, and the second light transmitting portion.

FIG. 9 is cross-sectional views showing a detailed first example of each of the light emitting portion 160, the first light transmitting portion 162, and the second light transmitting portion 164. In the example shown in this figure, the organic layer 120 includes a hole injection layer (HIL) 120*a*, a hole transport layer (HTL) 120*b*, an emission layer (EML) 120*c* (the EML 122 shown in FIGS. 1 to 7) and an electric transport layer (ETL) 120*d*. Note that a layer included in the organic layer 120 is not limited to the example shown in this figure. In one example, the organic layer 120 may further include an electron injection layer (EIL) between the ETL 120*d* and the conductive layer 130.

In the example shown in this figure, the thickness of the organic layer 120 is considerably thick, for example, 500 nm or more, preferably, for example, 1000 nm or more. More specifically, in the example shown in this figure, the thickness of the HIL 120*a* (that is, a layer (first layer) in contact with the conductive layer 110 and the insulating layer 140) in the organic layer 120 is considerably thick, for example, 100 nm or more, preferably, for example, 200 nm or more. This large thickness of the organic layer 120 can prevent the occurrence of a constructive interference due to visible light (light having wavelength of 380 nm or more and 780 nm or less) between the upper surface and the lower surface of the organic layer 120, that is, the formation of a microcavity. Accordingly, a color difference between the light emitting portion 160, and the first light transmitting portion 162 and the second light transmitting portion 164 is small.

In detail, a condition for occurrence of a constructive interference due to visible light between the upper surface and the lower surface of the organic layer 120 is as shown in the following formula (1).

$$2L = m\lambda \quad (1)$$

Here, L is an optical path length between the upper surface and the lower surface of the organic layer 120, m is an integer of 1 or more, and λ is wavelength of visible light. When the thickness of the organic layer 120 is thick, the optical path length L of the formula (1) becomes large. In this case, in order to satisfy the formula (1), the integer m needs to be large. Such a high order interference, however, may hardly occur in practice. This prevents, in the example shown in this figure, the occurrence of a constructive interference due to visible light (light having wavelength of 380 nm or more and 780 nm or less) between the upper surface and the lower surface of the organic layer 120, that is, the formation of a microcavity.

In the example shown in this figure, the thickness of the HIL 120*a* is substantially constant over the light emitting portion 160, the first light transmitting portion 162 and the second light transmitting portion 164. In other words, the thickness of the HIL 120*a* in the light emitting portion 160 is substantially equal to each of the thickness of the HIL 120*a* in the first light transmitting portion 162 and the thickness of the HIL 120*a* in the second light transmitting portion 164, and specifically is, for example, 95% or more and 105% or less of the thickness of the HIL 120*a* in the first light transmitting portion 162, and for example, 95% or more 105% or less of the thickness of the HIL 120*a* in the second light transmitting portion 164. Accordingly, the thickness of the organic layer 120 becomes substantially constant over the light emitting portion 160, the first light transmitting portion 162, and the second light transmitting portion 164.

In the example shown in this figure, the HIL 120*a* contains a conductive polymer material, specifically, for example, PEDOT:PSS. This can prevent increase of the voltage (that is, driving voltage) for causing the light emitting portion 160, even if the thickness of the HIL 120*a* is thick.

Furthermore, the HIL 120*a* is formed by an application process. Specifically, ink containing a hole injection material is applied. Subsequently, the ink is heated. Thereby, the HIL 120*a* is formed.

Figure 10:
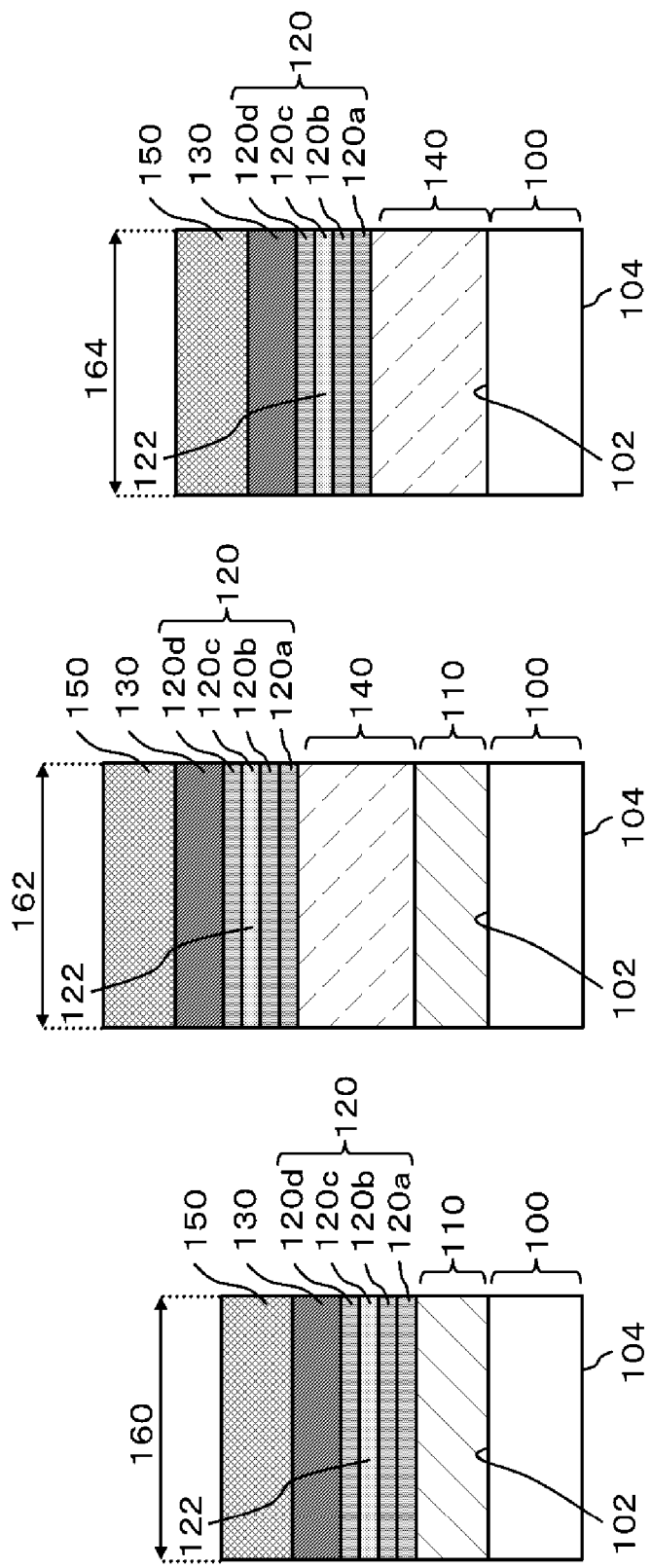
FIG. 10 is cross-sectional views showing a second detailed example of each of the light emitting portion, the first light transmitting portion, and the second light transmitting portion.

FIG. 10 is cross-sectional views showing a detailed second example of each of the light emitting portion 160, the first light transmitting portion 162, and the second light transmitting portion 164. The example shown in this figure is same as the example shown in FIG. 9, except for the following points.

In the example shown in this figure, the thickness of the organic layer 120 is considerably thin, for example, 50 nm or less, preferably, for example, 30 nm or less. This small thickness of the organic layer 120 prevents the occurrence of a constructive interference due to visible light (light having wavelength of 380 nm or more and 780 nm or less) between the upper surface and the lower surface of the organic layer 120, that is, the formation of a microcavity. Accordingly, a color difference between the light emitting portion 160, and the first light transmitting portion 162 and the second light transmitting portion 164 is small.

In detail, a condition for occurrence of a constructive interference due to visible light between the upper surface and the lower surface of the organic layer 120 is as shown in the above-described formula (1). When the thickness of the organic layer 120 is thin, the optical path length L of the formula (1) becomes small. Especially when the thickness of the organic layer 120 is considerably thin, any integer m may not satisfy the formula (1). This prevents, in the example shown in this figure, the occurrence of a constructive interference due to visible light (light having wavelength of 380 nm or more and 780 nm or less) between the upper surface and the lower surface of the organic layer 120, that is, the formation of a microcavity.

As described above, according to the present embodiment, the organic layer 120 extends over the light emitting portion 160, the first light transmitting portion 162, and the second light transmitting portion 164. Furthermore, the thickness of the organic layer 120 is considerably thick or considerably thin. Furthermore, the thickness of the organic layer 120 is substantially constant over the light emitting portion 160, the first light transmitting portion 162, and the second light transmitting portion 164. Accordingly, a color difference between the light emitting portion 160, and the first light transmitting portion 162 and the second light transmitting portion 164 is small.

Furthermore, according to the present embodiment, the insulating layer 140 extends over the light emitting portion 160, the first light transmitting portion 162, and the second light transmitting portion 164. Furthermore, the thickness of the insulating layer 140 is substantially constant over the light emitting portion 160, the first light transmitting portion 162, and the second light transmitting portion 164. Accordingly, a color difference between the light emitting portion 160, and the first light transmitting portion 162 and the second light transmitting portion 164 is small.

EXAMPLE

Figure 11:
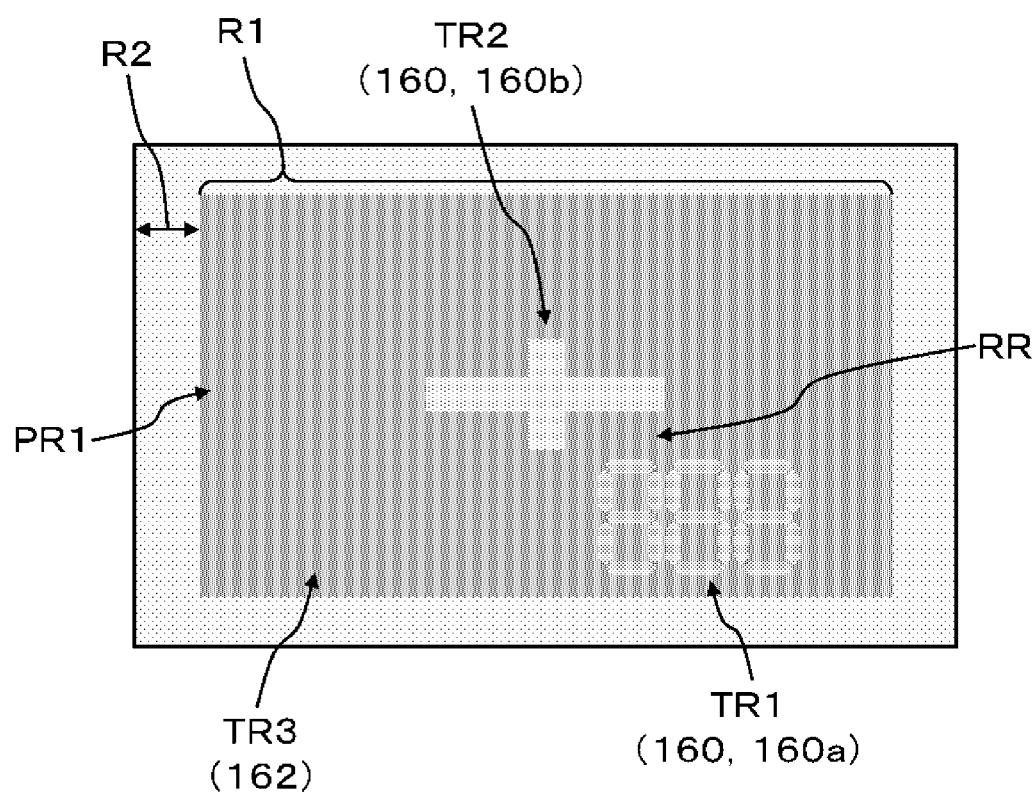
FIG. 11 is a plan view showing the light emitting device according to an Example.

FIG. 11 is a plan view showing the light emitting device 10 according to an Example. In this Example, the light emitting device 10 includes a first region R1 and a second region R2. The first region R1 includes a first light transmitting region TR1, a second light transmitting region TR2, and a third light transmitting region TR3. The first light transmitting region TR1 and the second light transmitting region TR2 are located inside the third light transmitting region TR3. In the example shown in this figure, an area of the third light transmitting region TR3 is larger than both an area of the first light transmitting region TR1 and an area of the second light transmitting region TR2. The third light transmitting region TR3 includes a region (region RR) between the first light transmitting region TR1 and the second light transmitting region TR2. The second region R2 is located outside the first region R1, and surrounds the first region R1 in the example shown in this figure. The first region R1 includes a first partial region PR1. The second region R2 may not include the cap layer 150. The first partial region PR1 is in contact with the second region R2 and extends along the outer edge of the first region R1 in the example shown in this figure.

The light emitting device 10 includes a first light emitting portion 160a (light emitting portion 160), a second light emitting portion 160b (light emitting portion 160), and a first light transmitting portion 162. The first light emitting portion 160a has a region functioning as the first light transmitting region TR1. In the example shown in this figure, the first light emitting portion 160a displays seven segments. The second light emitting portion 160b has a region functioning as the second light transmitting region TR2. In the example shown in this figure, the second light emitting portion 160b displays a + (plus) mark. The first light transmitting portion 162 has a region functioning as the third light transmitting region TR3.

The light emitting portion 160 shown in FIG. 11 is same as the light emitting portion 160 according to the embodiment. Specifically, as described with reference to FIG. 3, the light emitting portion 160 includes the stack of the substrate 100, the conductive layer 110, the organic layer 120, the conductive layer 130, and the cap layer 150. In particular, as described with reference to FIGS. 1 and 2, the first light emitting portion 160a and the second light emitting portion 160b emit light from the EML 122a and the EML 122b, respectively.

The first light transmitting portion 162 shown in FIG. 11 is same as the first light transmitting portion 162 according to the embodiment. Specifically, as described with reference to FIG. 4, the first light transmitting portion 162 includes the stack of the substrate 100, the conductive layer 110, the insulating layer 140, the organic layer 120, the conductive layer 130, and the cap layer 150.

In the same manner as in the embodiment, the first light emitting portion 160a, the second light emitting portion 160b, and the first light transmitting portion 162 have the common first conductive layer (conductive layer 130) (FIGS. 1 to 7). In other words, the conductive layer 130 extends over the first light emitting portion 160a, the second light emitting portion 160b, and the first light transmitting portion 162. Alternatively, a portion of the conductive layer 130 may be spaced apart.

In the example shown in this figure, when visible light (light having wavelength of 380 nm or more and 780 nm or less) is transmitted through the first light transmitting region TR1, the second light transmitting region TR2, and the third light transmitting region TR3, more specifically, when light from the D65 light source is transmitted through the first light transmitting region TR1, the second light transmitting region TR2, and the third light transmitting region TR3, both of a color difference between the first light transmitting region TR1 and the third light transmitting region TR3 and a color difference between the second light transmitting region TR2 and the third light transmitting region TR3 are small to some extent, and, for example, 6.5 or less, preferably for example, 3.2 or less in CIELAB. This reduces conspicuousness of both of the first light transmitting region TR1 and the second light transmitting region TR2.

In detail, in one example, even if a color difference between the first light transmitting region TR1 and the third light transmitting region TR3 is almost zero, when a color difference between the second light transmitting region TR2 and the third light transmitting region TR3 is large to some extent, then the second light transmitting region TR2 becomes conspicuous. In another example, even if a color difference between the second light transmitting region TR2 and the third light transmitting region TR3 is almost zero, when a color difference between the first light transmitting region TR1 and the third light transmitting region TR3 is large to some extent, then the first light transmitting region TR1 becomes conspicuous. In the example shown in this figure, both of a color difference between the first light transmitting region TR1 and the third light transmitting region TR3 and a color difference between the second light transmitting region TR2 and the third light transmitting region TR3 are small to some extent. This reduces conspicuousness of both of the first light transmitting region TR1 and the second light transmitting region TR2.

In another example, the first light transmitting region TR1 and the second light transmitting region TR2 may not be located inside the third light transmitting region TR3. In this example, the first light transmitting region TR1 and the second light transmitting region TR2 may be located in the vicinity of the third light transmitting region TR3, more specifically, the first light transmitting region TR1 and the second light transmitting region TR2 may be in contact with the third light transmitting region TR3. In this case, even if an area of the third light transmitting region TR3 is larger than any of an area of the first light transmitting region TR1 and an area of the second light transmitting region TR2, when both of a color difference between the first light transmitting region TR1 and the third light transmitting region TR3 and a color difference between the second light transmitting region TR2 and the third light transmitting region TR3 are small to some extent as described above, then both of the first light transmitting region TR1 and the second light transmitting region TR2 becomes inconspicuous.

In the example shown in this figure, when visible light (light having wavelength of 380 nm or more and 780 nm or less) is transmitted through the first light transmitting region TR1, the second light transmitting region TR2, and the third light transmitting region TR3, more specifically, when light from the D65 light source is transmitted through the first light transmitting region TR1, the second light transmitting region TR2, and the third light transmitting region TR3, a color difference between the first light transmitting region TR1 and the third light transmitting region TR3 and a color difference between the second light transmitting region TR2 and the third light transmitting region TR3 are large to some extent, and, for example, 0.4 or more in CIELAB. This enables to identify the first light transmitting region TR1, the second light transmitting region TR2, and the third light transmitting region TR3.

In detail, when a color difference between the first light transmitting region TR1 and the third light transmitting region TR3 is less than 0.4, it is difficult for human vision to identify the first light transmitting region TR1 and the third light transmitting region TR3, and in the same manner, when a color difference between the second light transmitting region TR2 and the third light transmitting region TR3 is less than 0.4, it is difficult for human vision to identify the second light transmitting region TR2 and the third light transmitting region TR3. The difficulty in identifying the first light transmitting region TR1, the second light transmitting region TR2, and the third light transmitting region TR3 makes it difficult to inspect the first light transmitting region TR1, the second light transmitting region TR2, and the third light transmitting region TR3. In the example shown in this figure, a color difference between the first light transmitting region TR1 and the third light transmitting region TR3 and a color difference between the second light transmitting region TR2 and the third light transmitting region TR3 are large to some extent. This enables to identify the first light transmitting region TR1, the second light transmitting region TR2 and the third light transmitting region TR3. This makes it easy to inspect the first light transmitting region TR1, the second light transmitting region TR2, and the third light transmitting region TR3.

In the example shown in this figure, when visible light (light having wavelength of 380 nm or more and 780 nm or less) is transmitted through the first light transmitting region TR1, the second light transmitting region TR2, and the third light transmitting region TR3, more specifically, when light from the D65 light source is transmitted through the first light transmitting region TR1, the second light transmitting region TR2, and the third light transmitting region TR3, both of a color difference between the first light transmitting region TR1 and the third light transmitting region TR3 and a color difference between the second light transmitting region TR2 and the third light transmitting region TR3 are smaller than a color difference between the first light transmitting region TR1 and the second light transmitting region TR2, in other words, both of a color difference between the first light transmitting region TR1 and the region RR and a color difference between the second light transmitting region TR2 and the region RR are smaller than a color difference between the first light transmitting region TR1 and the second light transmitting region TR2 in CIELAB. This can reduce conspicuousness of color difference from the first light transmitting region TR1 to the second light transmitting region TR2.

In detail, a color difference between the first light transmitting region TR1 and the second light transmitting region TR2 becomes more prominent for human perception when the first light transmitting region TR1 and the second light transmitting region TR2 are in contact with each other, than when the first light transmitting region TR1 and the second light transmitting region TR2 are spaced apart from each other. In the example shown in this figure, the region RR is located between the first light transmitting region TR1 and the second light transmitting region TR2. This can reduce conspicuousness of color difference from the first light transmitting region TR1 to the second light transmitting region TR2, even if the color difference between the first light transmitting region TR1 and the second light transmitting region TR2 is large.

When visible light (light having wavelength of 380 nm or more and 780 nm or less) is transmitted through the first light transmitting region TR1 and the second light transmitting region TR2, more specifically, when light from the D65 light source is transmitted through the first light transmitting region TR1, and the second light transmitting region TR2, a color difference between the first light transmitting region TR1 and the second light transmitting region TR2 is, for example, 0.4 or more and 6.5 or less in CIELAB.

In the example shown in this figure, when visible light (light having wavelength of 380 nm or more and 780 nm or less) is transmitted through the first partial region PR1 and the second region R2, more specifically, when light from the D65 light source is transmitted through the first partial region PR1 and the second region R2, a color difference between the first partial region PR1 and the second region R2 is small to some extent, and for example, 6.5 or less, preferably for example, 3.2 or less in CIELAB. This can prevent the first region R1 and the second region R2 from being conspicuous with each other.

In detail, when a color difference between the first partial region PR1 and the second region R2 is large to some extent, the first region R1 and the second region R2 become conspicuous with each other. In the example shown in this figure, a color difference between the first partial region PR1 and the second region R2 is small to some extent. This can prevent the first region R1 and the second region R2 from being conspicuous with each other.

In the example shown in this figure, when visible light (light having wavelength of 380 nm or more and 780 nm or less) is transmitted through the first partial region PR1 and the second region R2, more specifically, when light from the D65 light source is transmitted through the first partial region PR1 and the second region R2, a color difference between the first partial region PR1 and the second region R2 is large to some extent, and, for example, 0.4 or more in CIELAB. This enables to identify the first region R1 and the second region R2.

In detail, when a color difference between the first partial region PR1 and the second region R2 is less than 0.4, it is difficult for human vision to identify the first partial region PR1 and the second light transmitting region TR2. The difficulty in identifying the first partial region PR1 and the second region R2 makes it difficult to inspect the first region R1 and the second region R2. In the example shown in this figure, a color difference between the first partial region PR1 and the second region R2 is large to some extent. This enables to identify the first region R1 and the second region R2. This makes it easy to inspect the first partial region PR1 and the second region R2.

Although the embodiments and the examples have been described above with reference to the drawings, these are examples of the present invention, and various configurations other than the above may be adopted.

The invention claimed is:
1. A light emitting device comprising:
    a first light emitting portion comprising a first stack comprising:
        a substrate;
        a first conductive layer having a light transmitting property;
        an organic layer comprising an emission layer, the organic layer being between the substrate and the first conductive layer;
        a second conductive layer having a light transmitting property, the second conductive layer being between the substrate and the organic layer; and
    a first light transmitting portion spaced apart from the first light emitting portion, the first light transmitting portion comprising a second stack comprising:
        the substrate extending from the first light emitting portion;
        the first conductive layer extending from the first light emitting portion;
        the organic layer extending from the first light emitting portion;
        an insulating layer having a first opening defining the first light emitting portion, the insulating layer being between the substrate and the organic layer;
        a third conductive layer having a light transmitting property, the third conductive layer being between the substrate and the insulating layer and spaced apart from the second conductive layer;
    wherein the third conductive layer comprises a first end portion facing the first light emitting portion and covered by the insulating layer, a second end portion opposite to the first end portion and covered by the insulating layer,
    wherein the insulating layer continuously covers the third conductive layer between the first end portion and the second end portion,
    wherein a thickness of the insulating layer is substantially constant, and
    wherein a color difference between the first light emitting portion and the first light transmitting portion is 0.4 or more and 6.5 or less in CIELAB when visible light is transmitted through the first light emitting portion and the first light transmitting portion.
2. The light emitting device according to claim 1, comprising
    a first region and a second region,
    wherein the first region comprises the first light emitting portion and the first light transmitting portion,
    wherein the second region is outside the first region,
    wherein the first region comprises a first partial region in contact with the second region, and
    wherein a color difference between the first partial region and the second region is 0.4 or more in CIELAB when visible light is transmitted through the first partial region and the second region.
3. The light emitting device according to claim 2,
    wherein a color difference between the first partial region and the second region is 0.4 or more and 6.5 or less in CIELAB when visible light is transmitted through the first partial region and the second region.
4. The light emitting device according to claim 2,
    wherein the second region does not comprise a cap layer.
5. The light emitting device according to claim 1,
    wherein a thickness of the organic layer is 500 nm or more.
6. The light emitting device according to claim 1,
    wherein a thickness of the organic layer is 50 nm or less.
7. The light emitting device according to claim 1, further comprising:
    a second light emitting portion comprising a third stack comprising:
        the first conductive layer extending from the first light emitting portion,
    wherein the insulating layer has a second opening defining the second light emitting portion,
    wherein the first light emitting portion and the second light emitting portion are inside the first light transmitting portion, and
    wherein both of a color difference between the first light transmitting portion and the first light emitting portion and a color difference between the first light transmitting portion and the second light emitting portion are 6.5 or less in CIELAB when visible light is transmitted through the first light transmitting portion, the first light emitting portion and the second light emitting portion.
8. The light emitting device according to claim 1, further comprising:
    a second light transmitting portion between the first light emitting portion and the first light transmitting portion, the second light transmitting portion comprising a third stack comprising:
        the first conductive layer extending from the first light emitting portion; and
        the organic layer extending from the first light emitting portion.
9. The light emitting device according to claim 1, further comprising:
    a second light transmitting portion between the first light emitting portion and the first light transmitting portion, the second light transmitting portion comprising a third stack comprising:
        the first conductive layer extending from the first light emitting portion, and
        the insulating layer extending from the first light transmitting portion.
10. The light emitting device according to claim 1, further comprising:
    a second light emitting portion comprising a third stack comprising:
        the first conductive layer extending from the first light emitting portion,
    wherein the insulating layer has a second opening defining the second light emitting portion,
    wherein the first light transmitting portion comprises a region between the first light emitting portion and the second light emitting portion, and
    wherein both of a color difference between the first light emitting portion and the first light transmitting portion and a color difference between the second light emitting portion and the first light transmitting portion are smaller than a color difference between the first light emitting portion and the second light emitting portion in CIELAB when visible light is transmitted through the first light emitting portion, the second light emitting portion and the first light transmitting portion.

* * * * *